(12) United States Patent
Cascino et al.

(10) Patent No.: US 12,713,648 B2
(45) Date of Patent: Aug. 18, 2026

(54) ELECTRONIC DEVICE WITH REDUCED SWITCHING OSCILLATIONS

(71) Applicant: STMICROELECTRONICS S.r.l., Agrate Brianza (IT)

(72) Inventors: Salvatore Cascino, Gravina di Catania (IT); Alfio Guarnera, Trecastagni (IT); Mario Giuseppe Saggio, Aci Bonaccorsi (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 369 days.

(21) Appl. No.: 18/468,499

(22) Filed: Sep. 15, 2023

(65) Prior Publication Data

US 2024/0006527 A1 Jan. 4, 2024

Related U.S. Application Data

(63) Continuation-in-part of application No. 18/188,359, filed on Mar. 22, 2023.

(30) Foreign Application Priority Data

Apr. 1, 2022 (IT) ........................ 102022000006485

(51) Int. Cl.
*H10D 30/66* (2025.01)
*H10D 62/10* (2025.01)
(Continued)

(52) U.S. Cl.
CPC ......... *H10D 30/665* (2025.01); *H10D 62/106* (2025.01); *H10D 64/111* (2025.01);
(Continued)

(58) Field of Classification Search
CPC ...... H10D 30/665; H10D 1/66; H10D 62/105; H10D 30/662; H10D 64/517;
(Continued)

(56) References Cited

U.S. PATENT DOCUMENTS

2004/0012049 A1 1/2004 Shirai et al.
2017/0373140 A1* 12/2017 Hirler ................. H10D 62/111
(Continued)

OTHER PUBLICATIONS

Hofstetter et al., "Parasitic Turn-On of SiC MOSFETs—Turning a Bug into a Feature," University of Bayreuth, Center of Energy Technology (ZET), 7 pages, 2020.
(Continued)

*Primary Examiner* — Shahed Ahmed
(74) *Attorney, Agent, or Firm* — Seed Intellectual Property Law Group LLP

(57) ABSTRACT

The present disclosure is directed to an electronic device including a semiconductor body having a first electrical conductivity and provided with a front side; an active area of the semiconductor body, accommodating the source and gate regions of the electronic device and configured to accommodate, in use, a conductive channel of the electronic device; and an edge region of the electronic device, surrounding the active area. The edge region accommodates at least in part: i) an edge termination region, having a second electrical conductivity opposite to the first electrical conductivity, extending into the semiconductor body at the front side; and ii) a gate connection terminal of conductive material, electrically coupled to the gate region, extending on the front side partially superimposed on the edge termination region and capacitively coupled with a portion of the semiconductor body adjacent and external to the edge termination region.

20 Claims, 10 Drawing Sheets

(51) Int. Cl.

| | |
|---|---|
| ***H10D 64/00*** | (2025.01) |
| *H10D 62/832* | (2025.01) |
| *H10D 64/68* | (2025.01) |

(52) U.S. Cl.

CPC ....... *H10D 62/8325* (2025.01); *H10D 64/683* (2025.01); *H10D 64/685* (2025.01); *H10D 64/691* (2025.01); *H10D 64/693* (2025.01)

(58) Field of Classification Search

CPC ............... H10D 84/141; H10D 62/157; H10D 62/8325; H10D 64/519; H10D 30/66; H10D 30/655; H10D 62/60–605; H10D 30/601–608; H10D 64/691; H10D 64/693; H01L 21/0445–0495

See application file for complete search history.

(56) References Cited

U.S. PATENT DOCUMENTS

| | | | | |
|---|---|---|---|---|
| 2018/0019308 | A1 | 1/2018 | Tarui et al. | |
| 2018/0174938 | A1 | 6/2018 | Uchida | |
| 2018/0308972 | A1* | 10/2018 | Ohse | H10D 84/146 |
| 2021/0296446 | A1 | 9/2021 | Shimizu et al. | |
| 2023/0092013 | A1* | 3/2023 | Schulze | H01L 21/268 257/77 |
| 2023/0317843 | A1 | 10/2023 | Cascino et al. | |
| 2023/0387291 | A1* | 11/2023 | Hoshi | H10D 62/107 |
| 2024/0395924 | A1 | 11/2024 | Cascino et al. | |
| 2025/0022874 | A1* | 1/2025 | Nochida | H10D 8/411 |

OTHER PUBLICATIONS

Huang et al., "Effects of Edge Termination using Dielectric Field Plates with Different Dielectric Constants, Thicknesses and Bevel Angles," Department of Electrical and Computer Engineering, Rutgers University, 5 pages, 2014.

Liu et al., "Modeling and Analysis of SiC MOSFET Switching Oscillations," IEEE Journal of Emerging and Selected Topics in Power Electronics, vol. 4, No. 3, 10 pages, 2016.

* cited by examiner

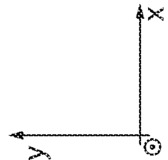
FIG. 1
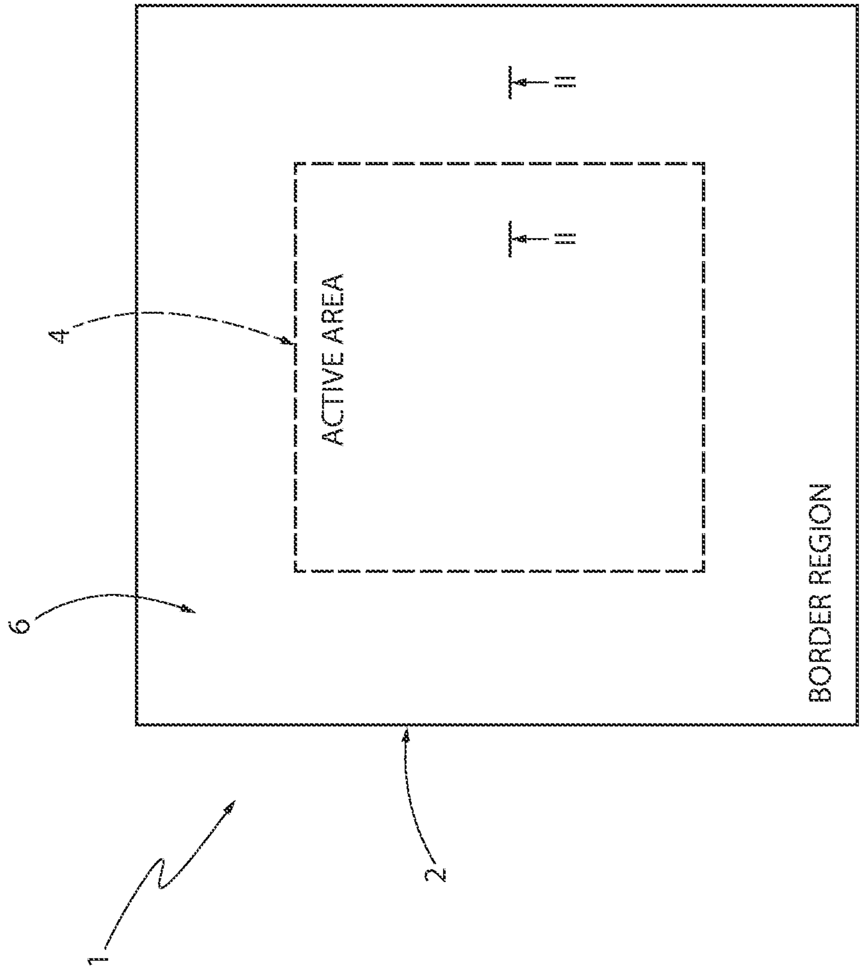

ACTIVE AREA
BORDER REGION
DRAIN
N-
N+
P+
N+
1
1a
1b
4
6
8
9
10
11
12
14
14a
14b
16
18
20
22a
22b
24
24a
24b
28
28'
30
32,C''gd
C'gd
x
y
z

ACTIVE AREA
BORDER REGION
DRAIN
N
N-
N+
P
P+
x
y
z
1″
4
6
28
28′
24
24a
24b
22a
22b
30
32, $C_{gd}''$
50
40
20
12
11
18
16
14
14a
14b
$C_{gd}'$
1a
1b
10
8
9

ACTIVE AREA
BORDER REGION
DRAIN
N-
N+
P+
P
N
1″
4
6
28′
28
24
24a
24b
24b′
22a
22b
30
32,$C_{gd}$″
50
60
40
20
12
11
18
16
14
14a
14b
$C_{gd}$′
1a
1b
10
8
9
x
z
y

1″
4
ACTIVE AREA
28′
28
BORDER REGION
28′
6
$32, C_{gd}''$
28
30
24b
24b′
16
18
24
14
14b
24a
22b
24b
$C_{gd}'$
1a
N+
P+
P
P
P
P
P
N
50
14a
11
12
20
40
22a
50
61
61
61
60
10
N-
N-
8
N+
N+
9
DRAIN
DRAIN
1b
z
y
x

ACTIVE AREA
BORDER REGION
DRAIN
N-
N+
N
P
P+

BORDER REGION
ACTIVE AREA
DRAIN
N+
N
N-
P
P+
x
y
z
1''''
1a
1b
4
6
8
9
10
11
12
14
14a
14b
16
18
20
22a
22b
24
24a
24b
28
28'
30
31
32,C''gd
33
35
40
50
C'gd

ELECTRONIC DEVICE WITH REDUCED SWITCHING OSCILLATIONS

BACKGROUND

Technical Field

The present disclosure relates to an electronic device, in particular a SiC MOSFET, with reduced switching oscillations.

Description of the Related Art

As known, semiconductor materials having a Wide Band Gap (WBG), in particular having an energy value Eg of the band gap higher than 1.1 eV, low on-state resistance ($R_{ON}$), a high thermal conductivity value, high operating frequency and high saturation value of the velocity of the conduction charges, are ideal for providing electronic components, such as for example diodes or transistors, in particular for power applications. A material having these characteristics, and for being used for the manufacturing of electronic components, is silicon carbide (SiC). In particular, silicon carbide, in its different polytypes (for example 3C—SiC, 4H—SiC, 6H—SiC), is preferable to silicon as regards the previously listed properties.

Electronic devices provided on a silicon carbide substrate, compared to similar devices provided on a silicon substrate, have several advantageous characteristics, such as for example a low output resistance in conduction, a low leakage current, high working temperature and high working frequencies.

WBG semiconductor devices may operate at high voltage, high temperature and high switching frequency. The SiC MOSFETs, which are among the most popular WBG power devices, have been extensively studied for fast switching power converters. However, the fast switching characteristics of SiC MOSFETs lead to undesired voltage and current oscillations during turn-ON and turn-OFF switching. The resulting voltage overload may damage the same device, increase power losses and introduce substantial noise due to electromagnetic interference. This limits the use of SiC MOSFETs in power electronics applications.

The switching oscillation, or "ringing" phenomenon, has been observed in many studies on SiC MOSFET devices. The switching oscillation phenomenon is closely related to the fast switching characteristics of the power transistors.

Furthermore, the current trend to form the body wells close to each other under the gate terminal, caused by the corresponding reduction in the extension of the gate terminal, entails a reduction in the capacitive coupling (gate-drain capacitance $C_{gd}$, or feedback capacitance) between gate and underlying drain (for vertical conduction MOSFET devices). The reduction of the gate-drain capacitance $C_{gd}$ may be directly correlated to an increase in the amplitude of the oscillations of the drain voltage during the turn-OFF step of the MOSFET (recovery step, or recovery, of the body diode of the MOSFET). In fact, as known, the intrinsic body diode of a MOSFET has the same physical limitations as discrete diodes, including undesired behavior during the inverse recovery step. Inverse recovery occurs when the body diode turns off while still carrying a positive forward current.

Known solutions to reduce switching oscillations include, for example, the optimization of the PCB layout and the increase of the MOSFET gate resistance. A further approach provides for controlling the gate charge of the power MOSFETs to suppress the turn-OFF oscillation. However, such approaches increase the complexity of manufacturing and of the device thus manufactured.

BRIEF SUMMARY

The present disclosure provides an electronic device that is free from the drawbacks of the prior art.

In various embodiments, an electronic device includes a semiconductor body having a first electrical conductivity and provided with a front side; an active area of the semiconductor body, accommodating source and gate regions of the electronic device and configured to accommodate, in use, a conductive channel of the electronic device; and an edge region of the electronic device, surrounding the active area. The edge region accommodates, at least in part, an edge termination region, having a second electrical conductivity opposite to the first electrical conductivity, extending into the semiconductor body at the front side; and a gate connection terminal of conductive material, electrically coupled to the gate region, extending on the front side partially superimposed on the edge termination region and capacitively coupled with a portion of the semiconductor body adjacent and external to the edge termination region.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein:

FIG. 1 illustrates a top view of a semiconductor die, accommodating an electronic device, in particular a MOSFET;

DETAILED DESCRIPTION

Figure 2:
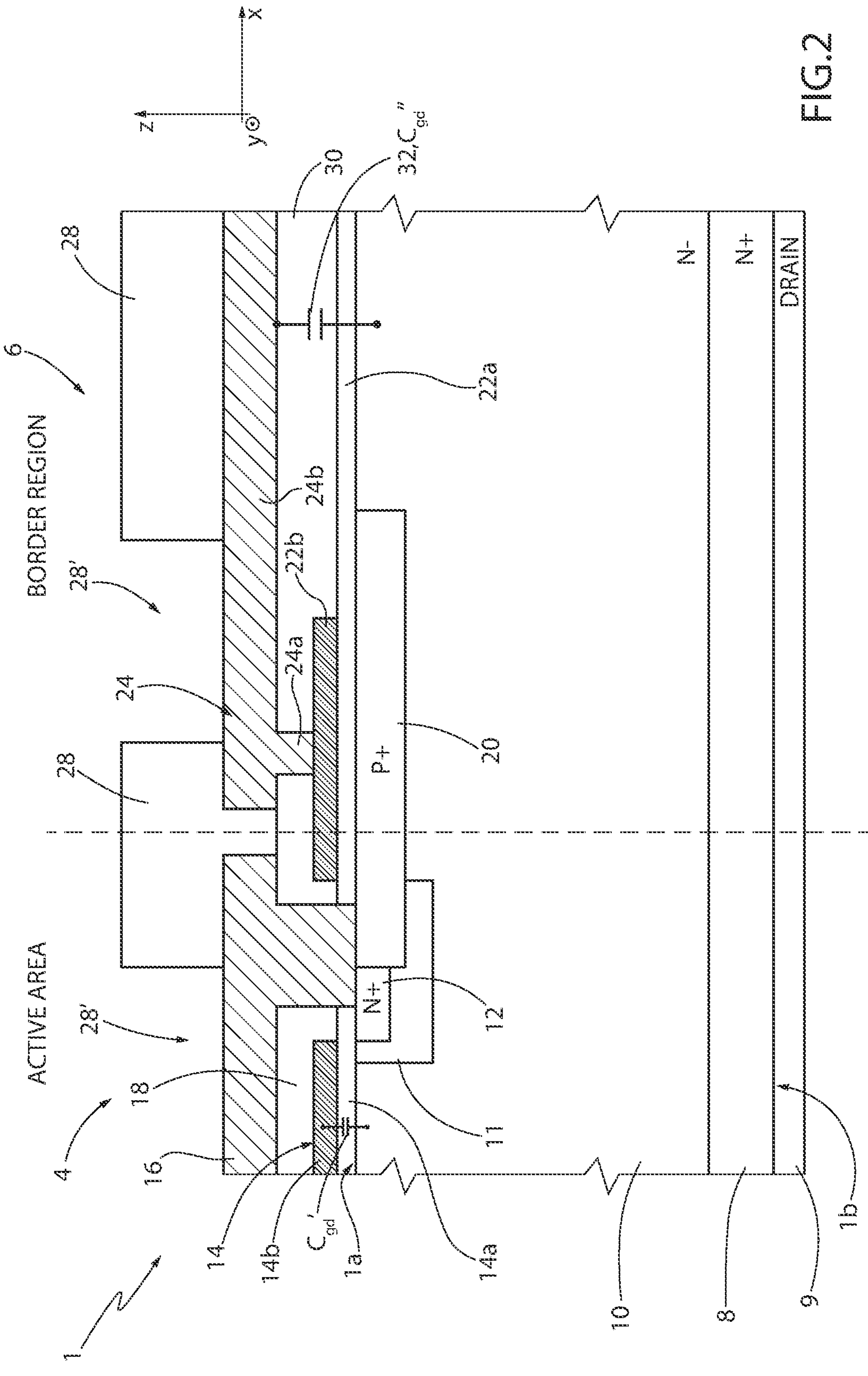
FIGS. 2-6 illustrate, in cross-sectional view, an electronic device, in particular a MOSFET, according to respective embodiments of the present disclosure.

The present disclosure is illustrated with reference to the accompanying drawings which show a wafer, or a part of it, in a triaxial system of X, Y, Z axes orthogonal to each other.

With reference to FIG. 1, a die or chip 1 is obtained after a dicing step of a semiconductor wafer. The die 1 is schematically illustrated in a top view, on the XY plane (this is the view at a front side 1*a* of the die 1). The die 1 comprises an external edge 2, which physically delimits the die 1. The die 1 accommodates at least one electronic device (not illustrated in FIG. 1), such as for example a MOSFET. Hereinafter, both the terms "electronic device" and "MOSFET" will be used, without thereby losing generality.

The die 1 includes at least two functional regions: an active area or region 4, typically extending into a central portion of the die 1, and an edge region 6, or peripheral or border region, which completely surrounds the active area 4.

Stated differently, the edge region 6 encircles the active area 4. The edge region extends, in other words, between the active area 4 and the external edge 2.

The active area 4 is the portion of the die 1 that accommodates elements of the electronic device that participate in the on-state conduction or, in general, the region of the die 1 wherein the conductive channel is formed (in use). The active area 4 accommodates, for example, source regions, drain regions, and channel regions including the conductive channel of the MOSFET. The drain region extends, for example in case of a vertical conduction device, at a rear side 1*b* (not visible in FIG. 1 as it is parallel and opposite to the front side 1*a*) of the die 1. The conductive channel extends into a region of the active area 4 comprised between the front side 1*a* and the rear side 1*b*, that is between the source and the drain, in a mainly vertical direction (along Z) towards the rear side 1*b*.

The edge region 6, on the other hand, is a region which does not have the channel region, more specifically, in use, the conductive channel. Stated differently, the conductive channel is contained in the active area 4, and does not extend into the edge region 6. The edge region 6 may have functional elements for reducing or preventing crowding of the electric field outside the active area.

FIG. 2 is a cross-sectional view (on the XZ plane) of a portion of the die 1, for example considered along scribe line II-II of FIG. 1. FIG. 2 illustrates portions of an electronic device, in particular a vertical conduction MOSFET, formed in the die 1.

With reference to FIG. 2, the die 1 includes: a semiconductor body, for example of Silicon Carbide (SiC) or Silicon (Si), having a first electrical conductivity (e.g., of N-type). The semiconductor body comprises a substrate 8 (N+ doped) and a drift layer 10 (N− doped) on the substrate 8. A drain terminal 9, for example of metal material, extends on the rear side 1*b* of the semiconductor body.

Body regions 11, having a second electrical conductivity (P) of type opposite to the first conductivity, and source regions 12, having the first conductivity (and N+ doping) in the body regions 11 are present at the front side 1*a* of the drift layer 10. The body regions 11 and the source regions 12 are regions implanted in the drift layer 10, in a per se known manner.

Gate regions 14 extend above the front side 1*a*, and include a gate dielectric 14*a* and a gate conductive region 14*b*. The gate dielectric is interposed between the gate conductive region 14*b* and the semiconductor body (in particular the drift layer 10).

FIG. 2 illustrates, for simplicity of representation, a single body region 11 accommodating a respective source region 12, whereon a respective gate region 14 extends. In particular, these illustrated body 11, source 12 and gate 14 regions extend in proximity of the end of the active area 4, after which the edge region 6 begins, as previously described.

The electronic device further comprises a source (e.g., metal) terminal 16, which extends in contact with the front side 1*a* at the source region 12, and is isolated from the gate region 14 by an insulating layer 18. As shown in FIG. 2, the source terminal 16 is on the source region 12 and an edge termination region 20.

The die 1 further accommodates, inside the semiconductor body (in particular in the drift layer 10), an edge termination region 20, implanted at the front side 1*a* and facing the front side 1*a*. The edge termination region 20 has the second electrical conductivity and a doping (P+) greater than that of the body region 11. The edge termination region 20 extends from the active area 4 in electrical contact with the source 12 and body 11 regions and proceeds along the X axis inside the edge region 6. The edge termination region 20 has the function of preventing or inhibiting the generation, in the dielectric layer 22*a* present under the region 22*b*, of an electric field having a value such that it damages the dielectric layer 22*a*.

A dielectric layer 22*a* (similar to the gate dielectric 14*a*) and a conductive layer 22*b* on the dielectric layer 22*a* (similar to the gate conductive region 14*b*) extend above the edge termination region 20 (on the front side 1*a*). However, the layers 22*a* and 22*b* do not have, in use, the function of gate terminal (i.e., they do not contribute to the formation of a conductive channel).

The electronic device further comprises a gate connection terminal 24, of conductive material, for example metal or N-type doped polysilicon, including a first portion 24*a* which extends in electrical contact with the conductive layer 22*b* and a second portion 24*b* which extends above and at a distance from the conductive layer 22*b*, in the edge region 6. The first and the second portions 24*a*, 24*b* are a single piece (monolithic) in structural and electrical continuity with each other. The second portion 24*b* forms an edge field plate, also said gate shield of the electronic device.

Furthermore, the gate connection terminal 24 is (in a manner not illustrated in Figure) in electrical contact with the gate region 14. The gate connection terminal 24 also has a region for electrical contact (e.g., by wire bonding or other technique) to provide the electronic device with gate bias during use.

The dashed line in FIG. 2, which discriminates between the active area 4 and the edge region 6, is to be understood as qualitative. For the purposes of the description of the present disclosure, the second portion 24*b* of the gate connection terminal 24 is completely accommodated in the edge region 6 and therefore is located in the right-hand portion with respect to the dashed demarcation line between the active area 4 and the edge region 6.

A passivation layer 28 extends on the gate connection terminal 24 and on the source terminal 16, to protect and insulate the gate connection terminal 24 and the source terminal 16. Openings 28' are provided in the passivation layer 28 for being able to electrically contact the gate connection terminal 24 and the source terminal 16 (as said, e.g. by wire bonding, to provide the respective biases during use).

The second portion 24*b* of the gate connection terminal 24 extends at a distance from the front side 1*a*, and in particular is separated from the front side 1*a* of the semiconductor body (in particular, from the drift layer 10) by a dielectric or insulating layer 30. The dielectric layer 30 also extends between the conductive layer 22*b* and the gate connection terminal 24; the physical contact between the first portion 24*a* of the gate connection terminal 24 and the conductive layer 22*b* occurs by a conductive through-via that extends through the entire thickness (along Z) of the dielectric layer 30.

The maximum extension along the Z axis (thickness) of the stack formed by the dielectric layer 30 and the underlying dielectric layer 22*a* is indicated hereinafter as $Th_{diel}$ and has a value, for example, comprised between 0.8 and 2.4 μm. In other words, $Th_{diel}$ represents the total thickness of the dielectric layer 22*a* plus the dielectric layer 30 between the second portion 24*b* of the gate connection terminal 24 and the front side 1*a*.

According to an embodiment of the present disclosure, the dielectric layer 22*a* and the dielectric layer 30 are of the same material.

According to a further embodiment of the present disclosure, the dielectric layer 22*a* extends exclusively below the conductive layer 22*b*, and is not present below the dielectric layer 30; in this case, the dielectric layer 30 extends between the front side 1*a* and the second portion 24*b* of the gate connection terminal 24 and therefore $Th_{diel}$ represents the maximum thickness of the dielectric layer 30 between the second portion 24*b* of the gate connection terminal 24 and the front side 1*a*.

According to an aspect of the present disclosure, the extension along the X axis of the gate connection terminal 24 (in particular, of the second portion 24*b*) is greater than the extension, again along X, of the edge termination region 20. In other words, in the sectional view of FIG. 2 or in the top view of FIG. 7, the gate connection terminal 24 is in part superimposed on the edge termination region 20 and in part extends beyond the edge termination region 20, in such a way that it faces the semiconductor body (in particular the drift layer 10) through the dielectric layer 30 and, if present, the insulating layer 22*a*, in correspondence of an N-type doped portion of the front side 1*a* of the semiconductor body, that is wherein the edge termination region 20 does not extend (is not present).

The extension along X (similarly, as may be seen from FIG. 7, also along Y) of the portion of the gate connection terminal 24 which faces the respective N-type doped portion of the front side 1*a* is indicated hereinafter as $L_{shield}$.

It is noted that the N-type doped portion of the front side 1*a* where the gate connection terminal 24 faces, is in electrical connection with the drain region 9 of the electronic device. A capacitive coupling is thus provided (schematically illustrated with the symbol of a capacitor 32 in FIG. 2) between the gate connection terminal 24 (first plate of the capacitor 32) and the drain region 9 (second plate of the capacitor 32), wherein the dielectric layer 30 and, if any, the insulating layer 22*a* form the dielectric interposed between the two plates of the capacitor 32. Since the gate connection terminal 24 (first plate of the capacitor 32) is in electrical connection with the gate terminal 14 of the MOSFET and the second plate of the capacitor 32 coincides, from an electrical point of view, with the drain region 9 of the MOSFET, the capacitive coupling occurs between the gate terminal 14 and the drain terminal 9 of the MOSFET.

In this manner, the total gate-drain capacitance $C_{gd}$ of the electronic device (the MOSFET) is given by the sum of two capacitive contributions: a first contribution $C_{gd}'$ is given by the capacitance between gate and drain present in active area 4, at the overlap region between gate terminal 14 and N-doped drift layer 10; a second contribution $C_{gd}''$ is given by the capacitance value symbolically identified by the capacitor 32.

The capacitance $C_{gd}$ is a non-linear function of the voltage and is a relevant parameter as it provides a feedback loop between the output and the input of the circuit. The capacitance $C_{gd}$ is also known as Miller capacitance as it makes the total dynamic input capacitance greater than the sum of the static capacitances. The turn-OFF delay of the MOSFET device is due to the time to discharge the input capacitance after removing the bias. Since the input capacitance is a function of the capacitance $C_{gd}$, the increase in the capacitance $C_{gd}$ (by the contribution $C_{gd}''$ added according to the present disclosure) entails a corresponding adjustment of the turn-OFF delay, and allows to balance the undesired behavior during the inverse recovery step of the body diode of the MOSFET, damping the recovery current oscillations. The capacitance $C_{gd}$ thus set or designed is such that it varies the response of the electronic device accordingly with respect to the switching oscillations during the turn-OFF step. In particular, an increase in the feedback capacitance corresponds to a damping of the switching oscillations during the turn-OFF step.

By suitably defining, during the design step, the extension (area) of capacitive coupling between the gate connection terminal 24 and the drift layer 10, a predefined and/or desired value of capacitance $C_{gd}$ may be generated. The effect discussed above is observed for any value of capacitance 32 introduced according to the present disclosure; however, the Applicant has verified that the values of the capacitance $C_{gd}''$ of tens of picofarads, for example in the range 65-130 pF for values of drain-source voltage (Vds) equal to or higher than 100 V, are a suitable solution. The capacitance $C_{gd}''$ is added, as said, to the capacitance $C_{gd}'$ still present in active area 4 and typically with a value lower than 25 pF for values of drain-source voltage (Vds) equal to or higher than 100 V.

Therefore, the following relationship (1) applies:

$$\frac{(1.15\cdot 10^5/\mathrm{m})*Th_{diel}*w_{AA}}{\varepsilon_{diel}} \le L_{shield} \le \frac{(2.3\cdot 10^5/\mathrm{m})*Th_{diel}*w_{AA}}{\varepsilon_{diel}} \quad (1)$$

Similarly, by making the constant $\varepsilon_0$ explicit, the relationship (1) may be expressed as:

$$\frac{(1\cdot 10^{-6}*\mathrm{F/m^2})*Th_{diel}*w_{AA}}{\varepsilon_{diel}\,\varepsilon_0} \le L_{shield} \le \frac{(2\cdot 10^{-6}*\mathrm{F/m^2})*Th_{diel}*w_{AA}}{\varepsilon_{diel}\,\varepsilon_0} \quad (2)$$

The constant $\varepsilon_{diel}$ is the dielectric constant of the material used for the dielectric layer 30 and, if any, for the dielectric layer 22*a* (assumed to be of the same material); the constant $\varepsilon_0$ is the dielectric constant of vacuum; $W_{AA}$ is the length, in XY plane view of FIG. 1 or FIG. 7, of a side along X or Y of the active area 4 (assumed to have a square shape); "F" indicates the unit of measurement "Farad"; and "m" the unit of measurement "meter."

Relationships (1) and (2) set forth above for $L_{shield}$ are also based on the following assumptions:

i) that the die 1 has a substantially square shape (possibly with rounded corners), with a side $W_{die}$ (e.g., $W_{die}$ equal to about 2000-8000 μm, for example 4000 μm);

ii) that the active area 4 has a substantially square shape (possibly with rounded edges), with a side $W_{AA}$ e.g. equal to about $\frac{3}{4}W_{die}$; and iii) that, in the active area, the value of capacity $C_{gd}'$ is lower than or equal to 1.5 pF/mm$^2$ for Vds≥100V.

Alternatively to what has been set forth above, the relationships (1) and (2) may be replaced by equivalent relationships (3) and respectively (4) illustrated hereinbelow, wherein the parameter $L_{shield}$ is replaced by the value of area $S_{shield}$ (in XY plane view) of the portion of the gate connection terminal 24 which contributes to the capacitance $C_{gd}''$:

$$\frac{(4.6\cdot 10^5/\mathrm{m})\cdot Th_{diel}\cdot w_{AA}^2}{\varepsilon_{diel}} \le S_{shield} \le \frac{(9.2\cdot 10^5/\mathrm{m})\cdot Th_{diel}\cdot w_{AA}^2}{\varepsilon_{diel}} \quad (3)$$

Similarly, by making the constant $\varepsilon_0$ explicit, the relationship (3) may be expressed as:

$$\frac{(4\cdot 10^{-6}\cdot F/\mathrm{m}^2)\cdot Th_{diel}\cdot w_{AA}^2}{\varepsilon_{diel}\,\varepsilon_0}\le S_{shield}\le\frac{(8\cdot 10^{-6}\cdot F/\mathrm{m}^2)*Th_{diel}*w_{AA}^2}{\varepsilon_{diel}\,\varepsilon_0}\quad(4)$$

Relationships (3) and (4) are approximate, as the area contributions at the edges are not considered, such contributions representing at most a value between 5% and 6% of the total area $S_{shield}$, given that $L_{shield} \ll W_{AA}$.

According to an aspect of the present disclosure, the capacitance contribution $C_{gd}$" is chosen in such a way that the total capacitance $C_{gd}$ (i.e., given by $C_{gd}$'+$C_{gd}$") is such that it triggers, during the turn-OFF of the MOSFET device, the per se known parasitic turn-ON (PTO) phenomenon. When the PTO phenomenon occurs, the MOSFET turns on unintentionally, causing a temporary (parasitic) current flow in the active area. The presence of this parasitic current mitigates the effect of undesired oscillations during the turn-OFF step, more particularly it reduces the total amplitude of the oscillation of the drain-source voltage by several percentage points (for example, for current pulses of 2 A/ns, there is observed a reduction of the drain bus supply voltage below 15%).

According to an embodiment, the insulating layer 22*a* may be omitted in the capacitive coupling region, so that the dielectric interposed between the two plates of the capacitor is formed exclusively by the dielectric layer 30. The dielectric material of the layer 30 may thus be suitably selected as needed, regardless of the material chosen for the insulating layer 22*a*.

The dielectric layer 30 (similarly, also the insulating layer 22*a*) may be one of: Silicon Oxide ($SiO_2$), Silicon Nitride (SiN, $Si_3N_4$), Silicon Oxynitride ($SiO_xN_y$), or a high-k dielectric material, with k>7. Usable high-k materials include, for example, Aluminum Nitride (AlN), Aluminum Oxynitride (ALON, $Al_2O_3$), Tantalum Oxide (TaO, $Ta_2O_5$), Hafnium Oxide (HfO2), Zirconium Oxide (ZrO2), etc.

Figure 3:
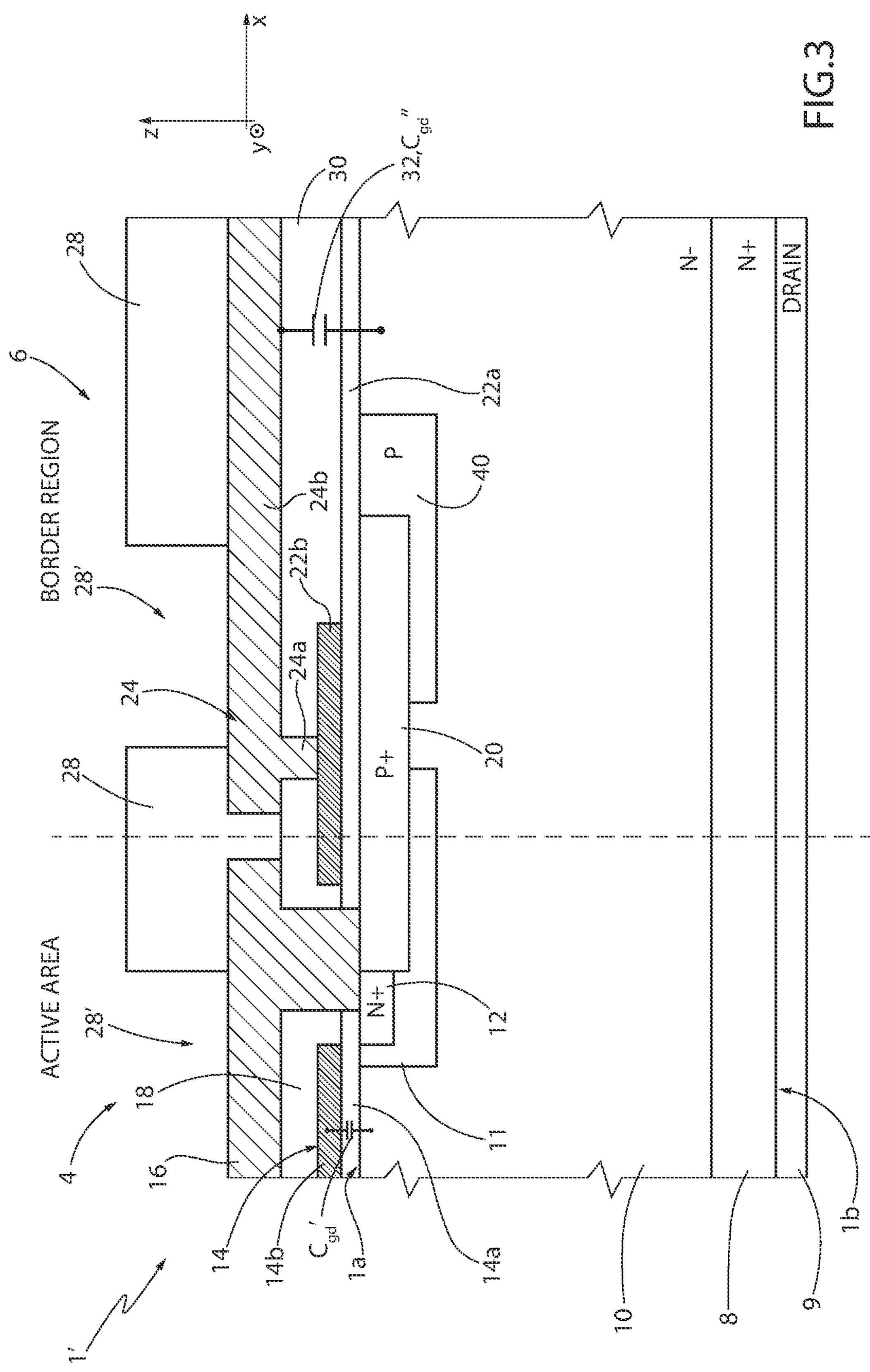

FIG. 3 illustrates a further embodiment of the present disclosure. Elements of FIG. 3 common to FIG. 2 are indicated with the same reference numbers and are not further described.

The die 1' of FIG. 3 comprises, in addition to what has already been described with reference to FIG. 2, a further implanted region 40 having the second electrical conductivity (of P-type) and doping lower than the doping of the edge termination region 20. The implanted region 40 extends at an end portion of the edge termination region 20, at a distance from the body region 11. Stated differently, the body region 11 and the implanted region 40 are positioned at opposite ends of the edge termination region 20. The implanted region 40 therefore extends as an extension of the edge termination region 20. The implanted region 40 has the function of distributing or thinning the field lines of the electric potential in such a way that it avoids a thickening of the field lines on the radius of curvature of the edge termination region 20, and thus maximizes the edge breakdown voltage value.

According to this embodiment, the extension along the X axis of the gate connection terminal 24 (in particular, of the second portion 24*b*) is greater than the maximum height reached, along the X axis, by the implanted region 40 (which, as said, extends as an extension of the edge termination region 20). In other words, in the sectional view of FIG. 3 (or in a corresponding top view as in FIG. 1), the gate connection terminal 24 is completely superimposed on the edge termination region 20 and also extends beyond the implanted region 40. In this manner the gate connection terminal 24 faces the semiconductor body (in particular the drift layer 10) through the dielectric layer 30 (and the insulating layer 22*a* if any), without the implanted region 40 being present therebetween. A capacitive coupling similar to that described with reference to FIG. 2 (illustrated with the symbol of the capacitor 32) is thus provided between the gate connection terminal 24 and the N-type semiconductor body.

Figure 4:
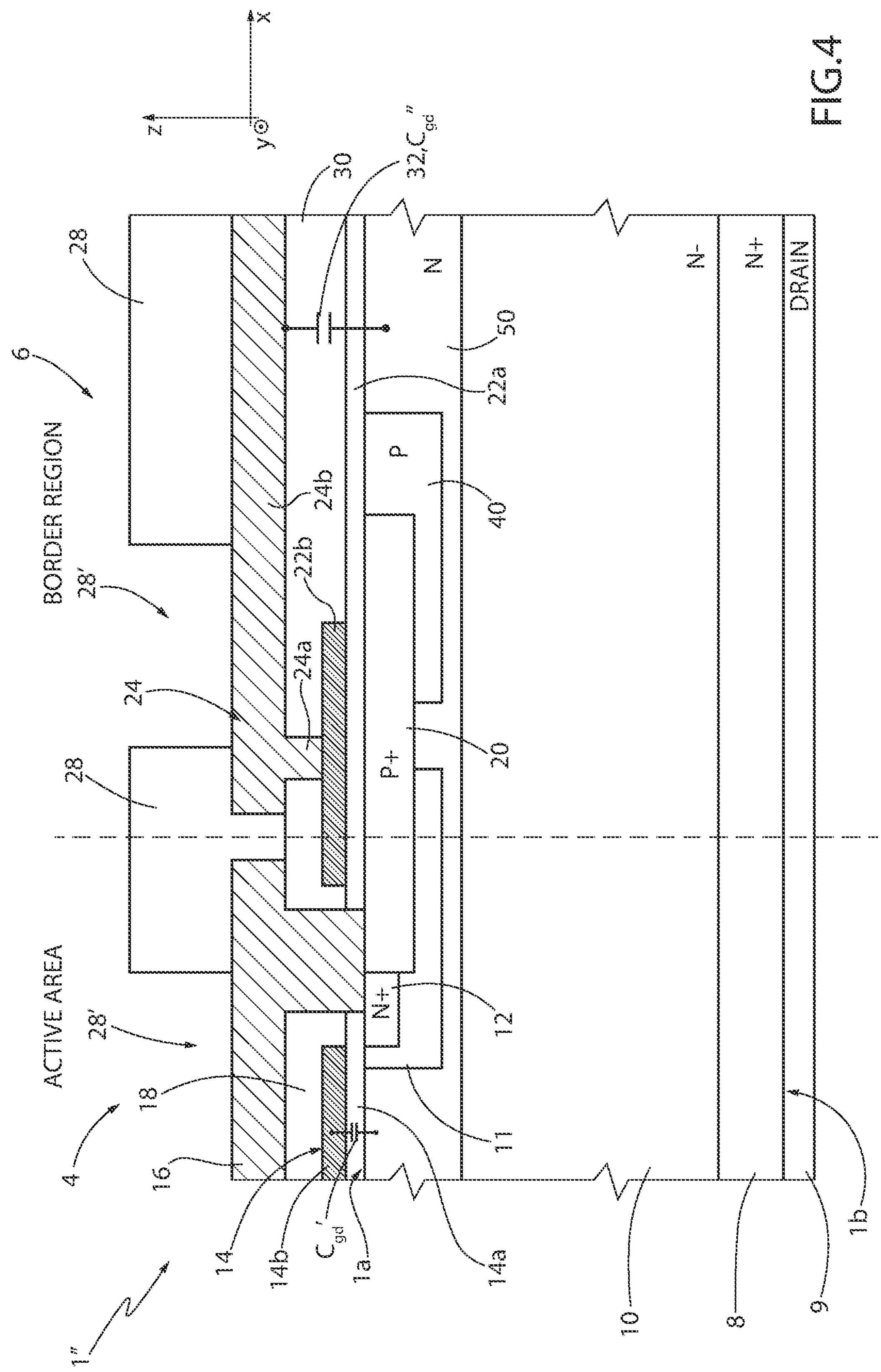

FIG. 4 illustrates a further embodiment of the present disclosure. Elements of FIG. 4 common to FIG. 2 and FIG. 3 are indicated with the same reference numbers and are not further described.

The die 1" of FIG. 4 comprises, in addition to what has already been described with reference to FIG. 2 and FIG. 3, a current spread layer (CSL) 50, which extends into the semiconductor body (in particular into the drift layer 10) facing the front side 1*a*. The current spread layer 50 is provided by one or more implants of doping species having the first conductivity and forms an enrichment layer which extends in depth from the front side 1*a*. Alternatively, the current spread layer 50 is obtained by epitaxial growth. The current spread layer 50 may also be formed by combining an epitaxial growth step and subsequent implant (for example in active area 4).

In one embodiment, the depth whereto the current spread layer 50 extends is greater than the maximum depth reached by the body region 11, the implanted region 40 and the edge termination region 20. In other words, in this embodiment, all of the body region 11, the implanted region 40 and the edge termination region 20 are completely contained within the current spread layer 50.

In a further embodiment, the current spread layer 50 extends (at least, or exclusively, in the edge region 6) to a lower depth than the maximum depth reached by the body region 11, the implanted region 40 and the edge termination region 20.

Regardless of the embodiment, the doping of the current spread layer 50 is greater than the doping of the drift layer 10 accommodating it. The current spread layer 50 has, for example, doping of the order of $5\cdot 10^{16}$ to $2\cdot 10^{17}$ atoms/$cm^3$.

The current spread layer 50 extends through the entire extension of the surface 1*a*, or for a part of it. Regardless of the layout chosen for the current spread layer 50, in the context of the present disclosure it extends at least in part superimposed (in top view) on the gate connection terminal 24. In this manner, the gate connection terminal 24 in part faces the current spread layer 50 through the dielectric layer 30 (and the insulating layer 22*a* if any) without the implanted region 40 or the edge termination region 20 being present therebetween. A capacitive coupling, similar to that described with reference to FIG. 2 or FIG. 3 (illustrated with the symbol of the capacitor 32) is thus provided between the gate connection terminal 24 and the current spread layer 50 in the semiconductor body.

The use of the current spread layer 50 is known per se and is widely used in MOSFETs for high frequency applications, with advantages and function that are known and not discussed herein. In the context of the present disclosure, the presence of the current spread layer 50 has the further advantage of improving, in use, the capacitive coupling between the gate connection terminal 24 and the semiconductor body (in particular, between the gate connection terminal 24 and the drain terminal).

Figure 5:
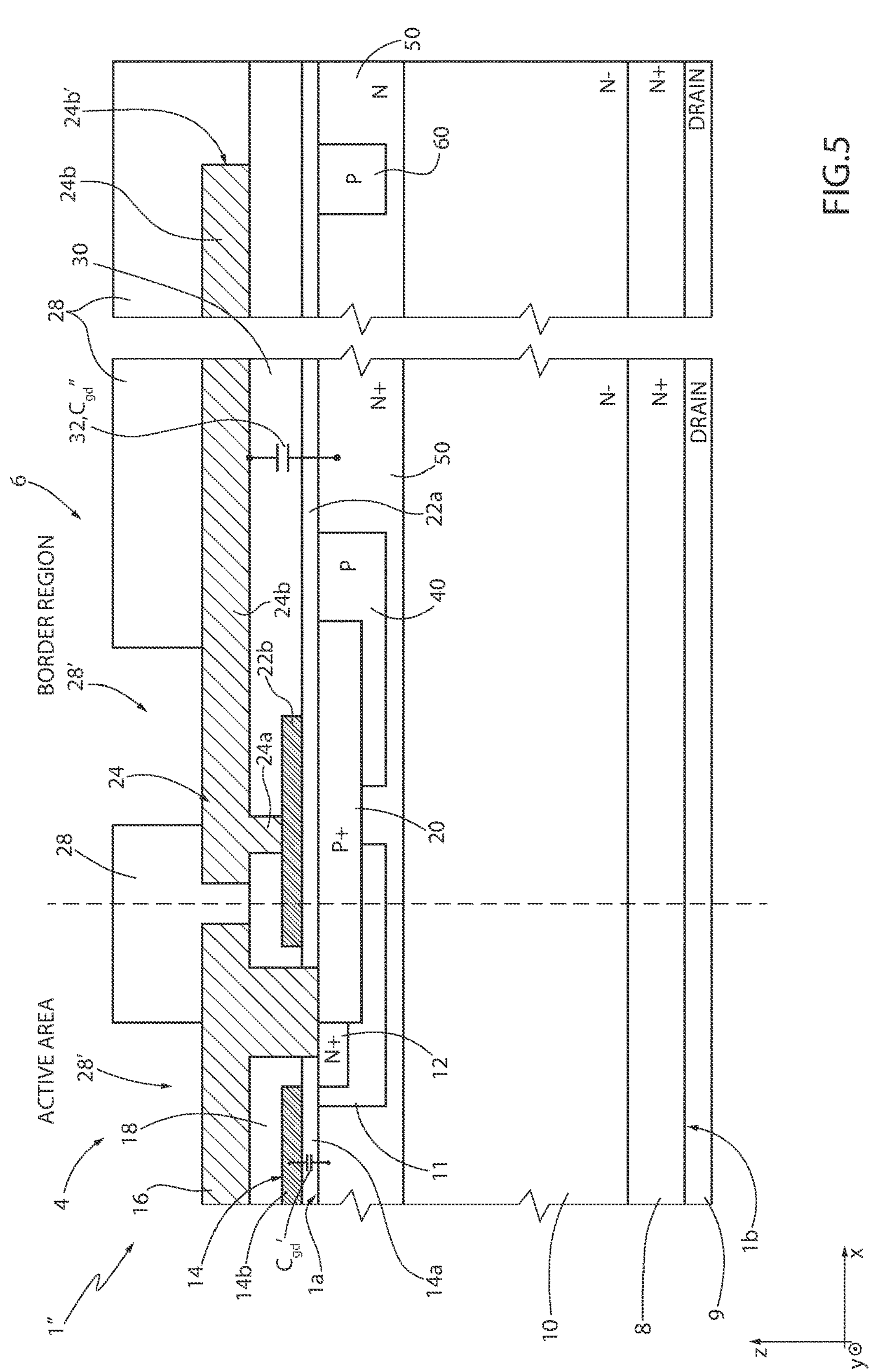

FIG. 5 illustrates a view of the die 1" (similarly, of the die 1 and 1', with the respective elements further present or missing with respect to die 1") wherein an expanded portion of the edge region 6 is shown. In particular, the view of FIG.

5 shows the presence of a further implanted region 60 in the semiconductor body (in particular in the drift layer 10) facing the front side 1*a*. The implanted region 60 has the second electrical conductivity (P-type, e.g. of the order of $5 \cdot 10^{16}$-$2 \cdot 10^{17}$ ions/$cm^3$) and, for example, is formed in the same step of forming the implanted region 40. The implanted region 60 extends at a distance from the implanted region 40 and, in top view (on the XY plane) is at least in part aligned (along the Z axis direction) with a final part 24*b*' of the gate connection terminal 24, in particular with a final part 24*b*' of the second portion 24*b* of the gate connection terminal 24. The presence of the implanted region 60 does not affect the feedback capacitance previously described and represented by the capacitor 32, since this capacitive coupling is in any case provided between the gate connection terminal 24 and the semiconductor body in the region comprised between the implanted region 40 and the implanted region 60. The implanted region 60 has the function of distributing or thinning the field lines of the electrical potential in such a way as that it avoids a thickening of the field lines on the bottom corner of the final part 24*b*' of the second portion 24*b*, thus obviating the risk of making the electric field critical at the final part 24*b*'.

In the embodiment of FIG. 5, the length $L_{shield}$ is the distance (along X and along Y) comprised between the implanted region 40 and the implanted region 60.

Figure 6:
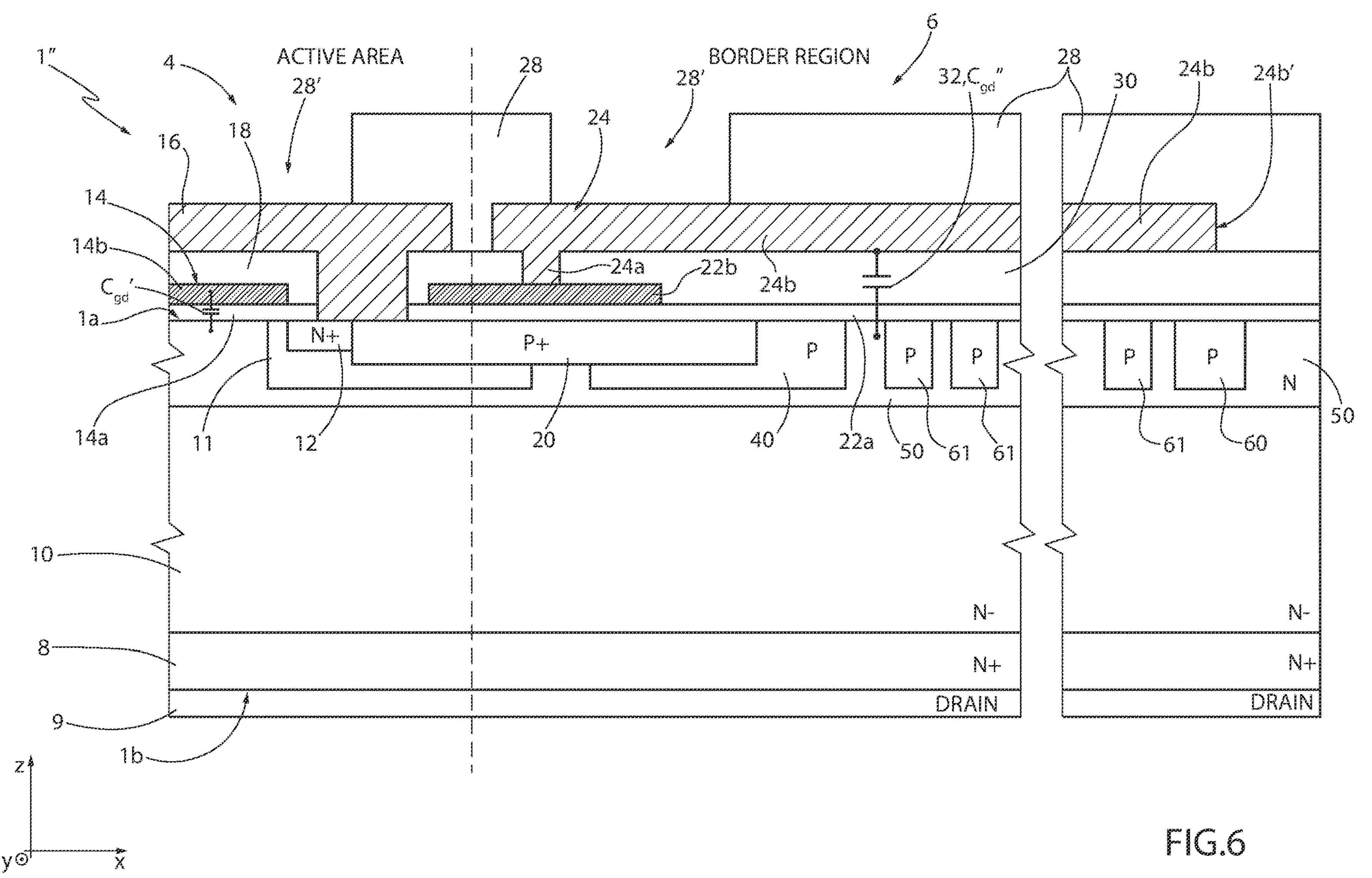

FIG. 6 illustrates a further embodiment of the present disclosure wherein one or more floating regions 61 of P-type, provided by implanting doping species at the front side 1*a*, are present between the implanted region 40 and the implanted region 60. The floating regions 61 extend at a distance from each other (i.e., an N-type portion of the semiconductor body—in particular of the drift layer 10—is present between a floating region 61 and the subsequent along the X axis direction). A similar layout may be observed along the Y direction.

In the embodiment of FIG. 6, the length $L_{shield}$ is the sum of the distances (along X and, similarly, along Y) between a floating region 61 and the subsequent floating region 61 (as well as the distance between the implanted region 40 and the floating region 61 immediately following, and between the implanted region 60 and the floating region 61 immediately preceding).

The embodiment of FIG. 6, relating to the presence of the floating regions 61, can be applied in a per se evident manner also to the embodiments of FIGS. 2 to 4.

Figure 7:
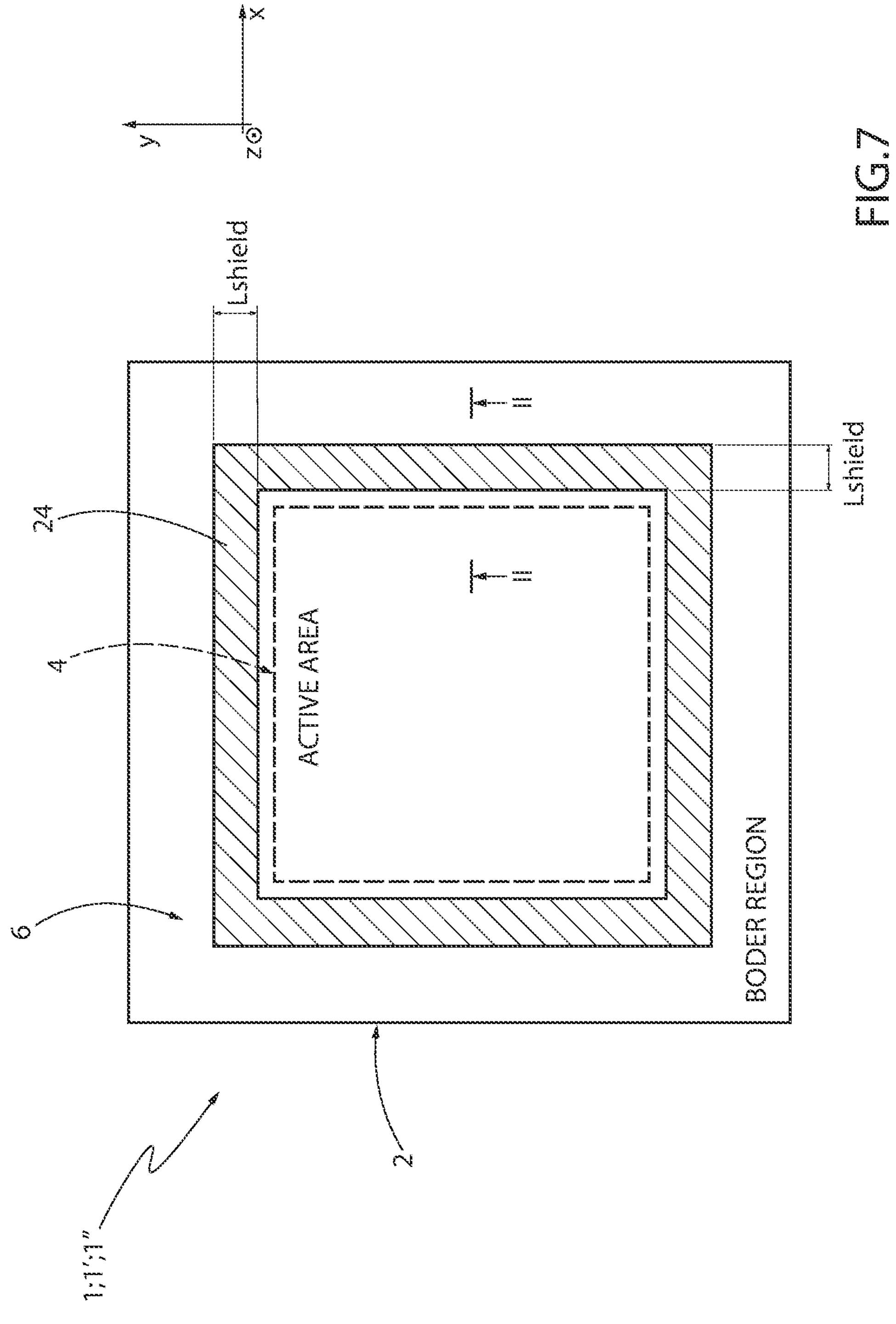
FIG. 7 illustrates, in top view, the semiconductor die of FIG. 1 wherein a gate connection terminal is present in the edge region, according to an aspect of the present disclosure.

FIG. 7 illustrates, in top view (on the XY plane) the die 1 of FIG. 1 wherein the extension of the gate connection terminal 24 is also schematically represented. As it is observed, the gate connection terminal 24 has, in this example, the shape of a ring and completely surrounds the active area 4. However, embodiments may be provided wherein the gate connection terminal 24 partially surrounds the active area 4, based on specific layout and design needs.

The advantages of the proposed solution are evident from what has been previously described.

In particular, according to the present technical solution, the capacitance $C_{gd}$ is a device-integrated distributed capacitance.

The capacitance $C_{gd}$ between the gate and drain terminals (feedback capacitance) is increased by a factor defined by the capacitive coupling between the gate connection terminal 24 and the underlying N-type doped region of the semiconductor body. In this manner, the increase of the feedback capacitance allows to dampen the amplitude of the oscillations of the drain voltage during the turn-OFF step of the MOSFET (recovery step, or recovery, of the body diode of the MOSFET).

Finally, it is clear that modifications and variations may be made to what has been described and illustrated herein without thereby departing from the scope of the present disclosure.

For example, in a further embodiment of the present disclosure illustrated in FIG. 8, a capacitive decoupling layer 70 of P-type is present, at the front side 1*a*, extending seamlessly below the gate connection terminal 24 or, in other words, interposed between the gate connection terminal 24 and the underlying N-type doped region of the semiconductor body. This capacitive decoupling layer 70 has for example a thickness comprised between 0.2-0.4 μm and exemplarily a doping of the order of 1016 ions/$cm^3$. In general, the capacitive decoupling layer 70 is designed in such a way that, when the device is in the on-state (for example for values of drain-source voltage Vds higher than 5 V or 10 V) the holes are depleted in the capacitive decoupling layer 70, and the capacitive decoupling layer 70 allows the capacitive coupling between the gate connection terminal 24 and the underlying N-type doped region of the semiconductor body, forming the capacitor 32 as previously described.

Figure 8:
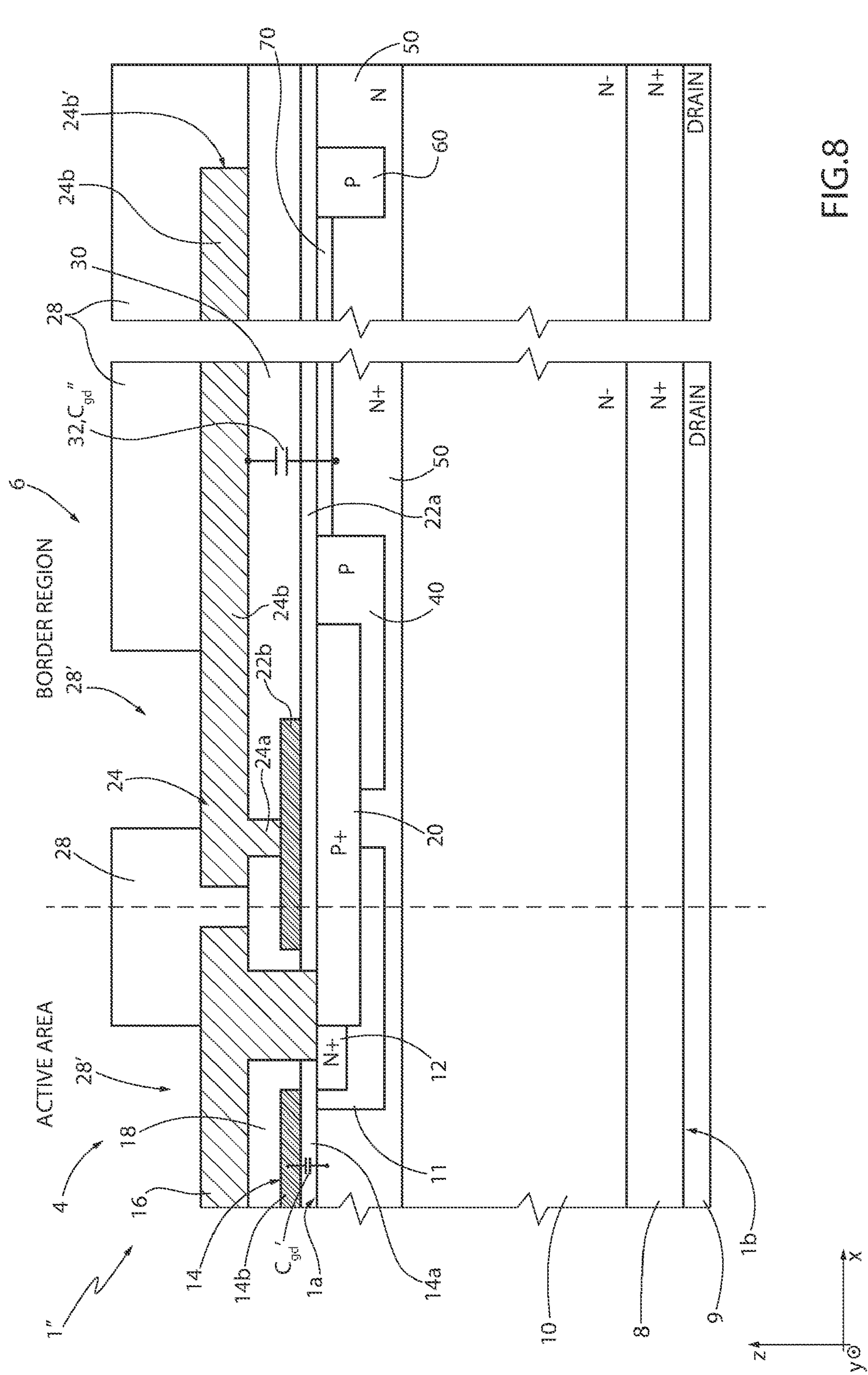
FIG. 8 illustrates, in cross-sectional view, an electronic device, in particular a MOSFET, according to a further embodiment of the present disclosure.

While the embodiment of FIG. 8 is based on FIG. 5, this embodiment (presence of the layer 70) applies similarly to the embodiments of FIGS. 2-4.

For example, while the present disclosure has been described with explicit reference to an N-channel device, the proposed technical solution applies, in a similar manner, to P-channel devices.

Figure 9:
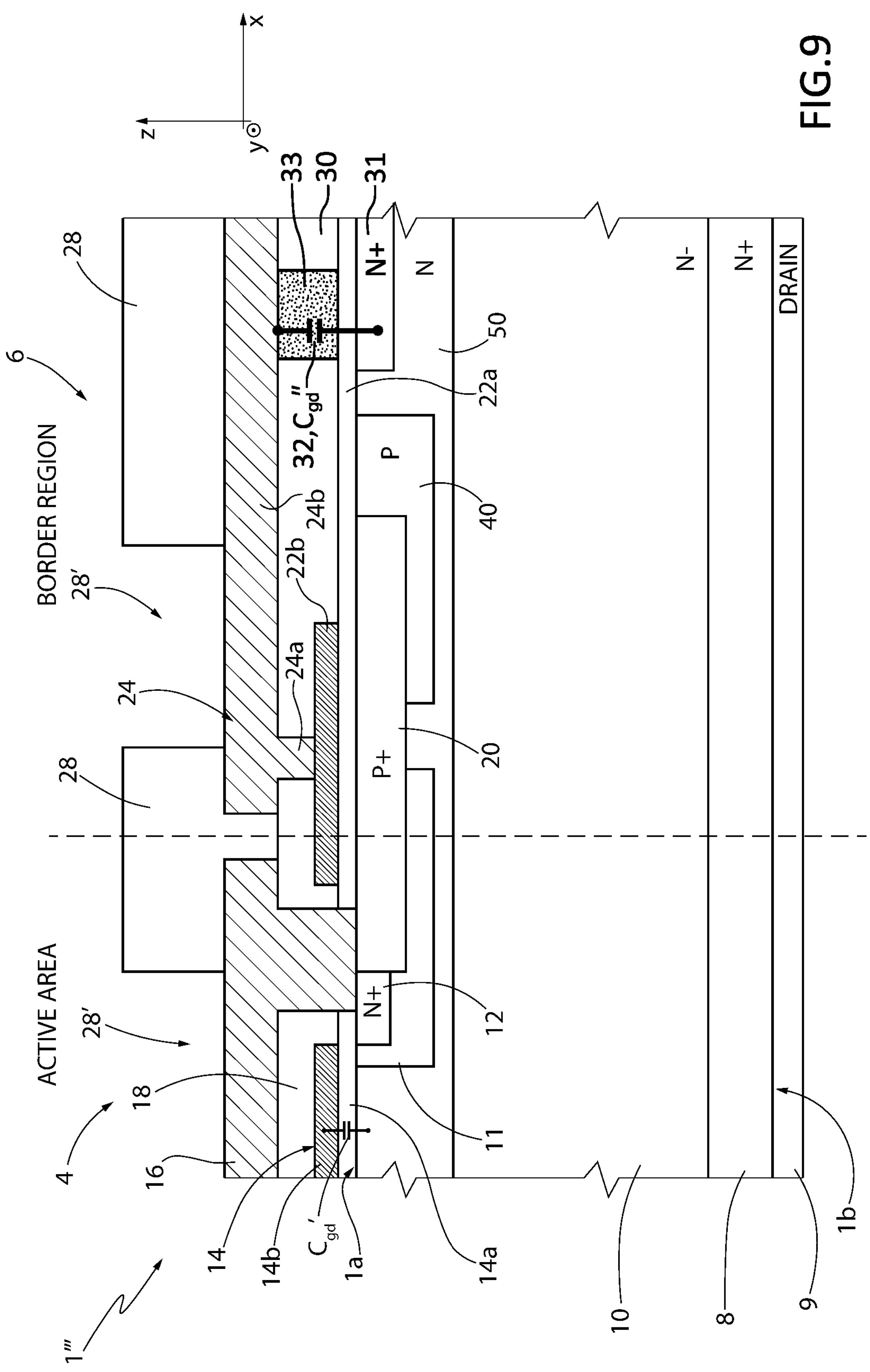
FIGS. 9-10 illustrate, in cross-sectional view, an electronic device, in particular a MOSFET, according to respective embodiments of the present disclosure.

FIG. 9 illustrates a further embodiment of the present disclosure. Elements of FIG. 9 common to FIG. 2, FIG. 3, and FIG. 4 are indicated with the same reference numbers and are not further described.

The die 1''' of FIG. 9 comprises, in addition to what has already been described with reference to FIG. 2, FIG. 3, and FIG. 4, an implanted region 31 and a high-k dielectric region 33.

The implanted region 31 extends into the semiconductor body (in particular into the current spread layer 50) facing the front side 1*a*. The implanted region 31 is provided by one or more implants of doping species having the first conductivity and forms an enrichment layer which extends in depth from the front side 1*a*.

In one embodiment, the depth whereto the implanted region 31 extends is less than the maximum depth reached by each of the body region 11, the implanted region 40, the edge termination region 20, and the current spread layer 50. The implanted region 31 is completely contained within the current spread layer 50.

The doping of the implanted region 31 is greater than the doping of the current spread layer 50 accommodating it. The implanted region 31 has, for example, doping greater than $1 \cdot 10^{18}$ atoms/$cm^3$.

The high-k dielectric region 33 extends between the second portion 24*b* of the gate connection terminal 24 and the implanted region 31, and directly overlies the implanted region 31.

The high-k dielectric region 33 may be a high-k dielectric material with k>7. Usable high-k materials include, for example, Aluminum Nitride (AlN), Aluminum Oxynitride (ALON, $Al_2O_3$), Tantalum Oxide (TaO, $Ta_2O_5$), Hafnium Oxide (HfO2), Zirconium Oxide (ZrO2), etc. In this embodiment, the dielectric layer 30 may be one of: Silicon Oxide ($SiO_2$), Silicon Nitride (SiN, $Si_3N_4$), or Silicon Oxynitride ($SiO_xN_y$).

As discussed above, in one embodiment, the dielectric layer 22*a* extends exclusively below the conductive layer 22*b*, and is not present below the dielectric layer 30. In this embodiment, the dielectric layer 30 and the high-k dielectric region 33 extends between the front side 1*a* and the second portion 24*b* of the gate connection terminal 24. As such, $Th_{diel}$ discussed above represents the maximum thickness of the dielectric layer 30 and the maximum thickness of the implanted region 31 between the second portion 24*b* of the gate connection terminal 24 and the front side 1*a*.

With the addition of the implanted region 31 and the high-k dielectric region 33, the gate connection terminal 24 in part faces the current spread layer 50 and the implanted region 31 through the dielectric layer 30 and the high-k dielectric region 33 (and the dielectric layer 22*a* if any) without the implanted region 40 or the edge termination region 20 being present therebetween. A capacitive coupling, similar to that described with reference to FIG. 2, FIG. 3, or FIG. 4 (illustrated with the symbol of the capacitor 32) is thus provided between the gate connection terminal 24 and the current spread layer 50 with the implanted region 31 in the semiconductor body. The gate connection terminal 24 extends over the implanted region 31, not modulable region, permitting to obtain a constant feedback capacitance when the drain-source voltage (Vds) increases. The presence of the implanted region 31 and the high-k dielectric region 33 has the further advantage of improving, in use, the capacitive coupling between the gate connection terminal 24 and the semiconductor body (in particular, between the gate connection terminal 24 and the drain terminal).

Compared to, for example, the embodiment shown in FIG. 4, the embodiment shown in FIG. 9 may have a high electric field value below the second portion 24*b* of the gate connection terminal 24 inside the high-k dielectric region 33 at a breakdown value. In order to decrease the electric field in the high-k dielectric region 33, a high-k dielectric and an increased thickness is used for the high-k dielectric region 33. In one embodiment, the high-k dielectric region 33 has a dielectric constant (k) value between 20 and 30 and has a thickness (along the Z axis between the second portion 24*b* of the gate connection terminal 24 and the front side 1*a*) between 3 and 3.5 micrometers. This allows the second portion 24*b* of the gate connection terminal 24 to be more distant from the front side 1*a*, maintain the benefits on the feedback capacitance as well as reduce the edge area, and attenuate the ringing amplitude during recovery.

Alternatively, the overlap of the between the second portion 24*b* of the gate connection terminal 24 and the high-k dielectric region 33 may be increased in order to increase the capacitive coupling between the gate connection terminal 24 and the current spread layer 50 with the implanted region 31 in the semiconductor body.

Figure 10:
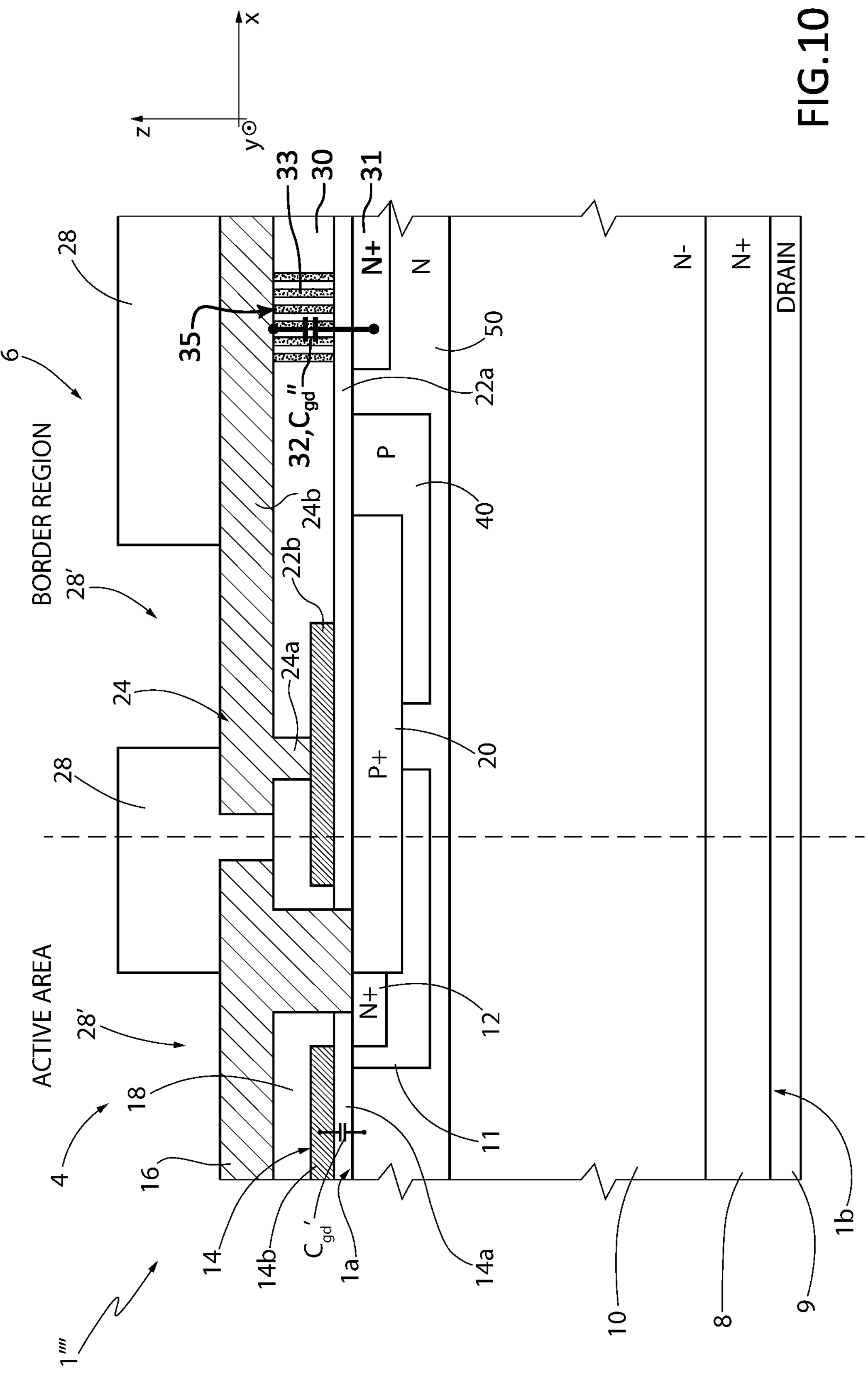

FIG. 10 illustrates a further embodiment of the present disclosure. Elements of FIG. 10 common to FIG. 2, FIG. 3, FIG. 4, and FIG. 9 are indicated with the same reference numbers and are not further described. In contrast to the die 1''' of FIG. 9, the die 1'''' of FIG. 10 includes a high-k dielectric region 33 with a grating pattern. Stated differently, the high-k dielectric region 33 includes a plurality of portions 35 that are spaced from each other by portions of the dielectric layer 30. As a result, the overlap region between the second portion 24*b* of the gate connection terminal 24 and the high-k dielectric region 33 is increased.

An electronic device may be summarized as including a semiconductor body (8, 10) having a first electrical conductivity (N) and provided with a front side (1*a*); an active area (4) of the semiconductor body, accommodating the source (12) and gate (14) regions of the electronic device and configured to accommodate, in use, a conductive channel of the electronic device; an edge region (6) of the electronic device, surrounding the active area (4) and accommodating at least in part: an edge termination region (20), having a second electrical conductivity (P) opposite to the first electrical conductivity (N), extending into the semiconductor body at the front side (1*a*); and a gate connection terminal (24) of conductive material, electrically coupled to the gate region (14), extending on the front side (1*a*) partially superimposed on the edge termination region (20), configured to establish, in use, a capacitive coupling (32, $C_{gd}$") with a portion of the semiconductor body having the first electrical conductivity (N), adjacent and external to the edge termination region (20).

The edge termination region (20) may be in electrical contact with the source region (12).

The active area (4) may further include a body region (11) having the second electrical conductivity (P), said source region extending inside the body region, and the edge termination region (20) may also be in electrical contact with the body region and has a doping dose greater than the respective doping dose of the body region.

The electronic device may further include a dielectric layer (30; 30, 22*a*) interposed between the front side (1*a*) and the gate connection terminal (24).

The gate connection terminal (24) may form a first plate of a capacitor (32), the semiconductor body may form a second plate of the capacitor (32), and the dielectric layer (30; 30, 22*a*) may be interposed between the first and the second plates of the capacitor (32).

The dielectric layer (30; 30, 22*a*) may be of Silicon Oxide, or Silicon Nitride, or Silicon Oxynitride.

The dielectric layer (30; 30, 22*a*) may be of a high-k material, in particular having a value of the parameter k higher than 7.

The electronic device may further include a first protection ring (40) having the second electrical conductivity (P) and a doping value lower than a doping value of the edge termination region (20), extending into the semiconductor body at a final portion of the edge termination region (20).

The electronic device may further include a second protection ring (60) having the second electrical conductivity (P) and a doping value lower than a doping value of the edge termination region (20), extending into the semiconductor body at a final portion (24*b*') of the gate connection terminal (24).

The electronic device may further include one or more floating regions (61) having the second electrical conductivity (P), extending into the semiconductor body between the first protection ring (40) and the second protection ring (60).

The edge region (6) may further include a current spread layer, CSL, (50) extending into the semiconductor body (8, 10) at the front side (1*a*), wherein the CSL (50) may have the first electrical conductivity (N) and doping value higher than a doping value of the portion of the semiconductor body (8, 10) wherein it is contained.

The electronic device may further include a drain region (9) extending at a rear side (1*b*), opposite to the front side (1*a*), of the semiconductor body (8, 10).

The portion of the semiconductor body having the first electrical conductivity (N) adjacent and external to the edge termination region (20) may also be in electrical contact with the drain region (9).

The gate region (14) may define, with portions of the semiconductor body (8, 10) extending below the gate region (14) and having the first electrical conductivity (N), a first contribution ($C_{gd}'$) of capacitance ($C_{gd}$) between the gate region and the drain region of the electronic device.

The capacitive coupling (32, $C_{gd}''$) may define a second contribution ($C_{gd}''$) of the capacitance ($C_{gd}$) between the gate region and the drain region which is added to said first contribution ($C_{gd}'$).

The second contribution ($C_{gd}''$) may be designed with a value such that it triggers a parasitic turn-ON, PTO, phenomenon, during a turn-OFF of the electronic device.

The overlap of the edge termination region (20) with the portion of the semiconductor body having the first electrical conductivity (N) adjacent and external to the edge termination region (20), may have a value $L_{shield}$ along a reference axis (X; Y) parallel to the front side (1*a*), which meets the relationship:

$$\frac{(1.15\cdot 10^5/\mathrm{m})*Th_{diel}*w_{AA}}{\varepsilon_{diel}} \le L_{shield} \le \frac{(2.3\cdot 10^5/\mathrm{m})*Th_{diel}*w_{AA}}{\varepsilon_{diel}}$$

or, equivalently:

$$\frac{(1\cdot 10^{-6}*\mathrm{F/m^2})*Th_{diel}*w_{AA}}{\varepsilon_{diel}\,\varepsilon_0} \le L_{shield} \le \frac{(2\cdot 10^{-6}*\mathrm{F/m^2})*Th_{diel}*w_{AA}}{\varepsilon_{diel}\,\varepsilon_0}$$

where:

$W_{AA}$ is the maximum extension, along said reference axis (X; Y), of the active area (4), the active area (4) having a square shape;

$\varepsilon_{diel}$ is the dielectric constant of the material of the dielectric layer (30; 30, 22*a*); and $\varepsilon_0$ is the dielectric constant of vacuum.

The edge region (6) may further accommodate a capacitive decoupling layer (70) extending into the semiconductor body (8, 10) at the front side (1*a*) laterally to the edge termination region (20) and interposed between the gate connection terminal (24) and the portion of the semiconductor body having the first electrical conductivity (N) adjacent and external to the edge termination region (20), wherein the capacitive decoupling layer (70) is configured to deplete majority carriers having the second electrical conductivity (P) when the electronic device is in use, thus allowing the establishment of said capacitive coupling.

The capacitive decoupling layer (70) may have a doping dose of the order of $10^{16}$ ions/$cm^3$, and extends into the semiconductor body with a thickness between 0.2 and 0.4 μm.

The electronic device may be a vertical conduction MOSFET.

The semiconductor body may be of Silicon Carbide.

A device may be summarized as including: a semiconductor body having a first electrical conductivity type; an active region in the semiconductor body, the active region including a source region, a gate region, a body region, and a channel region; an edge region in the semiconductor body and surrounding the active region, the channel region does not extend into the edge region and is within the active region; a current spread layer in a portion of the semiconductor body, the current spread layer having the first electrical conductivity type, the current spread layer having a doping value greater than a doping value of the portion of the semiconductor body; an edge termination region in the current spread layer, the active region, and the edge region, the edge termination region having a second electrical conductivity type; a first implanted region in the current spread layer and the edge region, the first implanted region having the second electrical conductivity type, the source region and the body region being spaced from the first implanted region by the edge termination region; a second implanted region in the current spread layer and the edge region, the second implanted region having the first electrical conductivity type, the second implanted region having a doping value greater than the doping value of the current spread layer; a conductive layer on the edge termination region; a first dielectric layer on the current spread layer and the conductive layer; a high-k dielectric region on the second implanted region; and a gate connection terminal including a first portion on the conductive layer and extending through first dielectric layer, and a second portion on the first dielectric layer, the second implanted region being spaced from the second portion of the gate connection terminal by the high-k dielectric region.

The high-k dielectric region may have a dielectric constant value between 20 and 30.

The high-k dielectric region may have a thickness between 3 and 3.5 micrometers.

The high-k dielectric region may include a plurality of portions that are spaced from each other by portions of the first dielectric layer.

The device may further include a second dielectric layer between the semiconductor body and the gate connection terminal.

The gate connection terminal may be a first plate of a capacitor, the second implanted region may be a second plate of the capacitor, and the high-k dielectric region may be interposed between the first plate and the second plate of the capacitor.

The high-k dielectric region may include Aluminum Nitride (AlN), Aluminum Oxynitride (ALON, Al2O3), Tantalum Oxide (TaO, Ta2O5), Hafnium Oxide (HfO2), or Zirconium Oxide (ZrO2).

The first dielectric layer may include Silicon Oxide (SiO2), Silicon Nitride (SiN, Si3N4), or Silicon Oxynitride (SiOxNy).

The device may further include a drain region on the semiconductor body, the drain region and the gate connection terminal being on opposite sides of the semiconductor body.

The device may be a vertical conduction MOSFET.

The semiconductor body may include Silicon Carbide.

A device may be summarized as including: a semiconductor body having a first electrical conductivity type; a current spread layer in a portion of the semiconductor body, the current spread layer having the first electrical conductivity type, the current spread layer having a doping value greater than a doping value of the portion of the semiconductor body; a source region the current spread layer; a body region the current spread layer; an edge termination region in the current spread layer, the edge termination region having a second electrical conductivity type; an implanted region in the current spread layer, the implanted region having the first electrical conductivity type, the implanted region having a doping value greater than the doping value of the current spread layer; a conductive layer on the edge termination region; a dielectric layer on the current spread layer and the conductive layer; a high-k dielectric region on the implanted region; and a gate terminal electrically coupled to the conducive layer, a portion of the gate terminal being spaced from the implanted region by the high-k dielectric region.

The semiconductor body may have an active region and an edge region that encircles the active region, the source region and the body region may be in the active region, the edge termination region may be in the active region and the edge region, the implanted region may be in the edge region, and the edge termination region may be electrically coupled to the source region and the body region.

The device may further include a gate region electrically coupled to the gate terminal; and a source terminal electrically coupled to the source region, a portion of the source terminal positioned between the gate region and the conductive layer.

The high-k dielectric region may have a dielectric constant value between 20 and 30.

The high-k dielectric region may have a thickness between 3 and 3.5 micrometers.

The high-k dielectric region may include a plurality of portions that are spaced from each other by portions of the dielectric layer.

A device may be summarized as including: a semiconductor body having an active region and an edge region that surrounds the active region, the semiconductor body having a first electrical conductivity type, the semiconductor body including a current spread layer having a first doping value; a source region in the active region and the current spread layer; a body region in the active region and the current spread layer; a gate region in the active region; an edge termination region in the active region, the edge region, and the current spread layer, the edge termination region having a second electrical conductivity type; an implanted region in the current spread layer and the edge region, the implanted region being spaced from the edge termination region by a portion of the current spread layer, the implanted region having the first electrical conductivity type, the implanted region having a second doping value greater than the first doping value; a dielectric layer on the current spread layer; a high-k dielectric region on the current spread layer and extending through the dielectric layer; and a gate terminal electrically coupled to the gate region, a portion of the gate terminal directly overlying the high-k dielectric region and the implanted region.

The high-k dielectric region may have a dielectric constant value between 20 and 30, and may have a thickness between 3 and 3.5 micrometers.

The high-k dielectric region may include a plurality of portions that are spaced from each other by portions of the dielectric layer.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:

a semiconductor body having a first electrical conductivity type;

an active region in the semiconductor body, the active region including a source region, a gate region, a body region, and a channel region;

an edge region in the semiconductor body and surrounding the active region, the channel region does not extend into the edge region and is within the active region;

a current spread layer in a portion of the semiconductor body, the current spread layer having the first electrical conductivity type, the current spread layer having a doping value greater than a doping value of the portion of the semiconductor body;

an edge termination region in the current spread layer, the active region, and the edge region, the edge termination region having a second electrical conductivity type;

a first implanted region in the current spread layer and the edge region, the first implanted region having the second electrical conductivity type, the source region and the body region being spaced from the first implanted region by the edge termination region;

a second implanted region in the current spread layer and the edge region, the second implanted region having the first electrical conductivity type, the second implanted region having a doping value greater than the doping value of the current spread layer;

a conductive layer on the edge termination region;

a first dielectric layer on the current spread layer and the conductive layer;

a high-k dielectric region on the second implanted region; and a gate connection terminal including a first portion on the conductive layer and extending through first dielectric layer, and a second portion on the first dielectric layer, the second implanted region being spaced from the second portion of the gate connection terminal by the high-k dielectric region.

2. The device of claim 1 wherein the high-k dielectric region has a dielectric constant value between 20 and 30.

3. The device of claim 1 wherein the high-k dielectric region has a thickness between 3 and 3.5 micrometers.

4. The device of claim 1 wherein the high-k dielectric region includes a plurality of portions that are spaced from each other by portions of the first dielectric layer.

5. The device of claim 1, further comprising:

a second dielectric layer between the semiconductor body and the gate connection terminal.

6. The device of claim 1 wherein the gate connection terminal is a first plate of a capacitor, the second implanted region is a second plate of the capacitor, and the high-k dielectric region is interposed between the first plate and the second plate of the capacitor.

7. The device of claim 1 wherein the high-k dielectric region includes Aluminum Nitride (AlN), Aluminum Oxynitride (ALON, Al2O3), Tantalum Oxide (TaO, Ta2O5), Hafnium Oxide (HfO2), or Zirconium Oxide (ZrO2).

8. The device of claim 1 wherein the first dielectric layer includes Silicon Oxide (SiO2), Silicon Nitride (SiN, Si3N4), or Silicon Oxynitride (SiOxNy).

9. The device of claim 1, further comprising:

a drain region on the semiconductor body, the drain region and the gate connection terminal being on opposite sides of the semiconductor body.

10. The device of claim 1 wherein the device is a vertical conduction MOSFET.

11. The device of claim 1 wherein the semiconductor body includes Silicon Carbide.

12. A device, comprising:

a semiconductor body having a first electrical conductivity type;

a current spread layer in a portion of the semiconductor body, the current spread layer having the first electrical conductivity type, the current spread layer having a doping value greater than a doping value of the portion of the semiconductor body;

a source region in the current spread layer;

a body region in the current spread layer;

an edge termination region in the current spread layer, the edge termination region having a second electrical conductivity type;

an implanted region in the current spread layer, the implanted region having the first electrical conductivity type, the implanted region having a doping value greater than the doping value of the current spread layer;

a conductive layer on the edge termination region;

a dielectric layer on the current spread layer and the conductive layer;

a high-k dielectric region on the implanted region; and a gate terminal electrically coupled to the conducive layer, a portion of the gate terminal being spaced from the implanted region by the high-k dielectric region.

13. The device of claim 12 wherein the semiconductor body has an active region and an edge region that encircles the active region, the source region and the body region are in the active region, the edge termination region is in the active region and the edge region, the implanted region is in the edge region, and the edge termination region is electrically coupled to the source region and the body region.

14. The device of claim 12, further comprising:

a gate region electrically coupled to the gate terminal; and a source terminal electrically coupled to the source region, a portion of the source terminal positioned between the gate region and the conductive layer.

15. The device of claim 12 wherein the high-k dielectric region has a dielectric constant value between 20 and 30.

16. The device of claim 12 wherein the high-k dielectric region has a thickness between 3 and 3.5 micrometers.

17. The device of claim 12 wherein the high-k dielectric region includes a plurality of portions that are spaced from each other by portions of the dielectric layer.

18. A device, comprising:

a semiconductor body having an active region and an edge region that surrounds the active region, the semiconductor body having a first electrical conductivity type, the semiconductor body including a current spread layer having a first doping value;

a source region in the active region and the current spread layer;

a body region in the active region and the current spread layer;

a gate region in the active region;

an edge termination region in the active region, the edge region, and the current spread layer, the edge termination region having a second electrical conductivity type;

an implanted region in the current spread layer and the edge region, the implanted region being spaced from the edge termination region by a portion of the current spread layer, the implanted region having the first electrical conductivity type, the implanted region having a second doping value greater than the first doping value;

a dielectric layer on the current spread layer;

a high-k dielectric region on the current spread layer and extending through the dielectric layer; and a gate terminal electrically coupled to the gate region, a portion of the gate terminal directly overlying the high-k dielectric region and the implanted region.

19. The device of claim 18 wherein the high-k dielectric region has a dielectric constant value between 20 and 30, and has a thickness between 3 and 3.5 micrometers.

20. The device of claim 18 wherein the high-k dielectric region includes a plurality of portions that are spaced from each other by portions of the dielectric layer.

* * * * *